US007094679B1

(12) United States Patent
Li et al.

(10) Patent No.: US 7,094,679 B1

(45) Date of Patent: Aug. 22, 2006

(54) CARBON NANOTUBE INTERCONNECT

(75) Inventors: Jun Li, Sunnyvale, CA (US); Meyya Meyyappan, San Jose, CA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 10/390,254

(22) Filed: Mar. 11, 2003

(51) Int. Cl.
*H01L 21/4763* (2006.01)
*H01L 21/302* (2006.01)

(52) U.S. Cl. ...................... 438/618; 438/691; 438/800; 438/626

(58) Field of Classification Search ................ 257/758, 257/296, 309; 438/618, 622, 626, 691, 800
See application file for complete search history.

(56) References Cited

U.S. PATENT DOCUMENTS

| | | | | |
|---|---|---|---|---|
| 6,231,744 | B1 | 5/2001 | Ying et al. | |
| 6,407,922 | B1 | 6/2002 | Eckblad et al. | |
| 6,432,740 | B1 | 8/2002 | Chen | |
| 6,359,288 | B1 | 3/2003 | Ying et al. | |
| 6,538,367 | B1 * | 3/2003 | Choi et al. | 313/309 |
| 6,803,260 | B1 * | 10/2004 | Shin et al. | 438/142 |
| 6,831,017 | B1 * | 12/2004 | Li et al. | 438/694 |
| 6,856,016 | B1 | 2/2005 | Searls et al. | |
| 6,958,216 | B1 * | 10/2005 | Kelley et al. | 435/6 |
| 2002/0145194 | A1 | 10/2002 | O'Connor et al. | |
| 2003/0111333 | A1 | 6/2003 | Montgomery et al. | |
| 2003/0117770 | A1 | 6/2003 | Montgomery et al. | |
| 2003/0189202 | A1 * | 10/2003 | Li et al. | 257/14 |
| 2003/0231471 | A1 | 12/2003 | De Lorenzo et al. | |
| 2004/0013598 | A1 | 1/2004 | McElrath et al. | |
| 2004/0099208 | A1 * | 5/2004 | Kang et al. | 117/84 |
| 2004/0150311 | A1 * | 8/2004 | Jin | 313/309 |
| 2004/0250753 | A1 * | 12/2004 | Kang et al. | 117/92 |

FOREIGN PATENT DOCUMENTS

| | | | |
|---|---|---|---|
| EP | 13299953 | A1 | 8/2003 |
| WO | WO 03/054958 | A1 | 7/2003 |
| WO | WO 03/072679 | A1 | 9/2003 |
| WO | WO 03/107419 | A1 | 12/2003 |

OTHER PUBLICATIONS

L. Delzeit, et al, "Directed Growth of Single-Walled Carbon Nanotues" International Journal of Nanoscience, 2002, vol. 1, nos. 3 & 4, 197-204, World Scientific Publishing Co.

H. Hwang, et al, "Simultions and Experimentals of Etching of Silicon in HBr Plasmas for High Aspect Ratio Features," J. Vac. Sci. Technol., 2002, 2199, vol. B 20, Amer Vac Soc.

B. Wei, R. Vajtai, and P. Ajayan, "Reliabilty and Current Carrying Capacity of Carbon Nanotubes," Applied Physics Letters, Aug. 20, 2001, 1172-1174, vol. 79, vol. 79, No. 8, AIP.

A. URAL, et al, "Electric-Field-Aligned Growth of Single-Walled Carbon Nanotubes on Surfaces," Applied Physics Letters, Oct. 28, 2002, 3464-3466, vol. 81, No. 18. AIP.

* cited by examiner

*Primary Examiner*—Hsien-Ming Lee
(74) *Attorney, Agent, or Firm*—Robert M. Padilla; John F. Schipper

(57) ABSTRACT

Method and system for fabricating an electrical interconnect capable of supporting very high current densities ($10^6$–$10^{10}$ Amps/cm$^2$), using an array of one or more carbon nanotubes (CNTs). The CNT array is grown in a selected spaced apart pattern, preferably with multi-wall CNTs, and a selected insulating material, such as $SiO_w$ or $Si_uN_v$, is deposited using CVD to encapsulate each CNT in the array. An exposed surface of the insulating material is planarized to provide one or more exposed electrical contacts for one or more CNTs.

19 Claims, 7 Drawing Sheets

CMP

Top Metal Layer Deposition

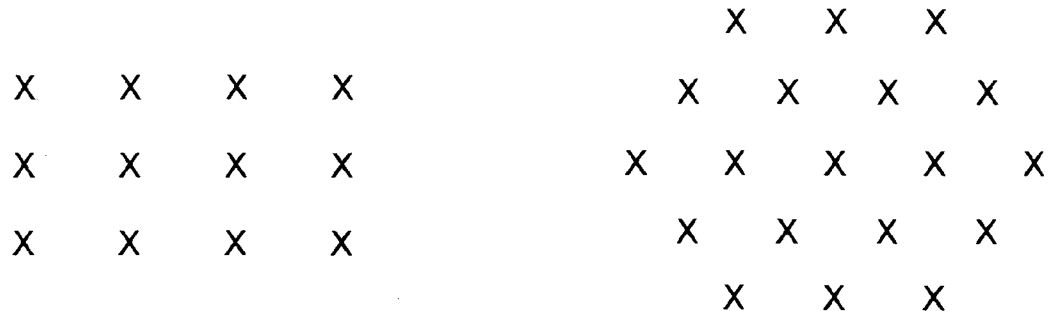
FIG. 2A
FIG. 2B
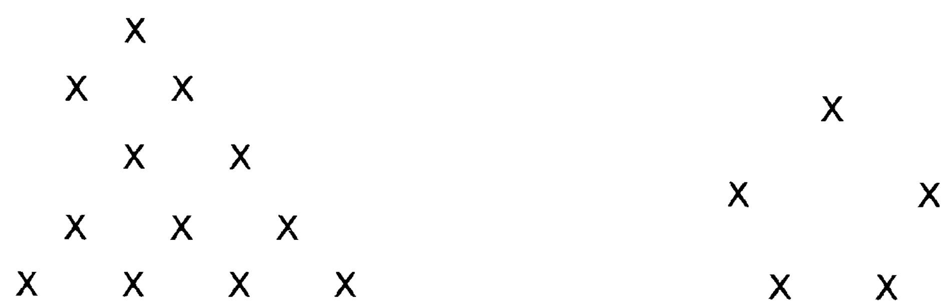
FIG. 2C
FIG. 2D
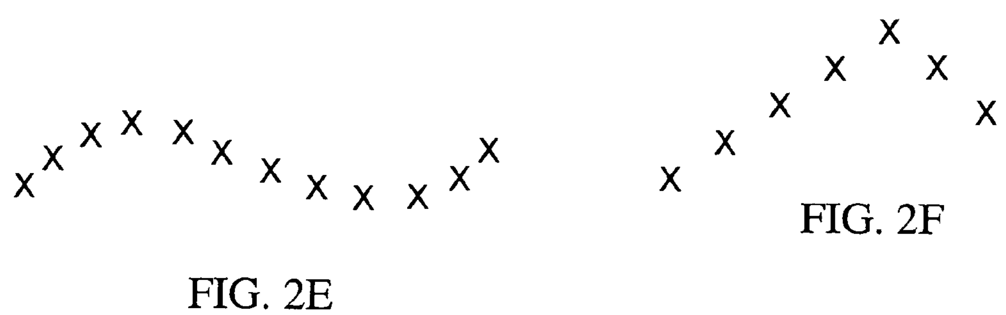
FIG. 2E
FIG. 2F

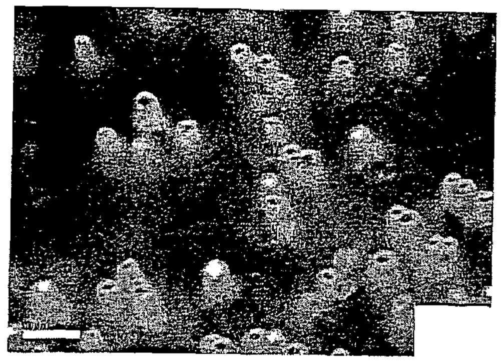
FIG. 3
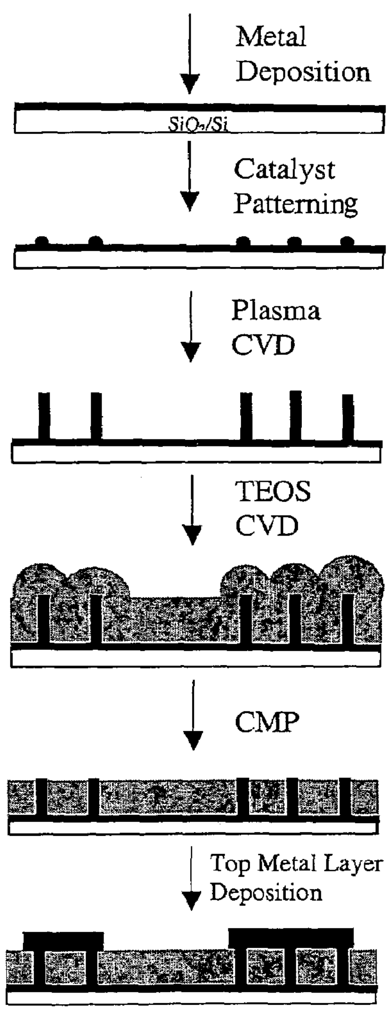
FIG. 4A
FIG. 4B
FIG. 4C
FIG. 4D
FIG. 4E
FIG. 4F

FIG. 5A FIG. 5B FIG. 5C
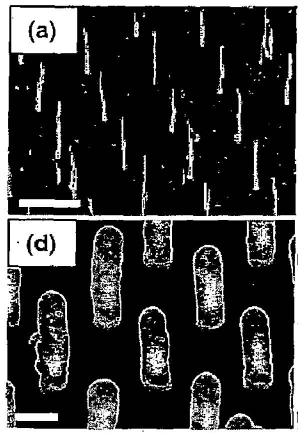
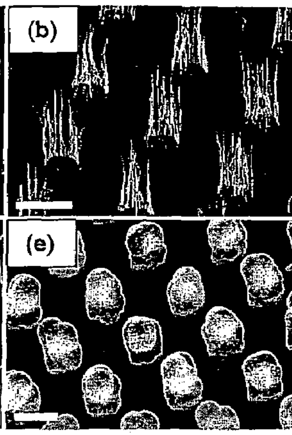
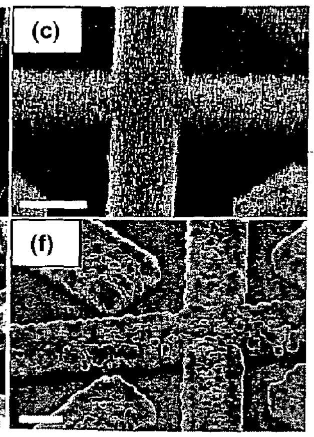
FIG. 5D FIG. 5E FIG. 5F
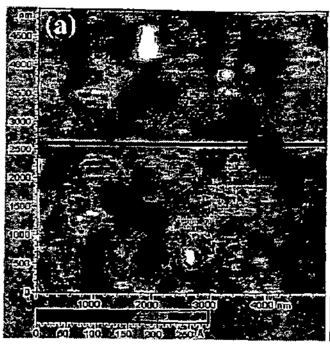
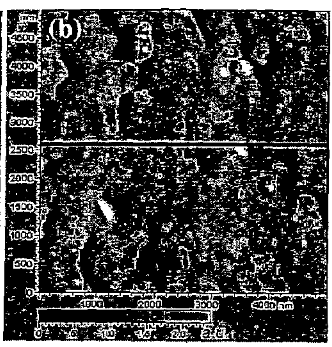
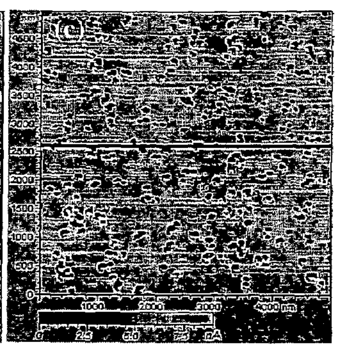
FIG. 6A FIG. 6B FIG. 6C Create patterned raised structure Conductive layer deposition Catalyst layer deposition Electric-field guided CNT growth Dielectric encapsulation Chemical Mechanical Polishing

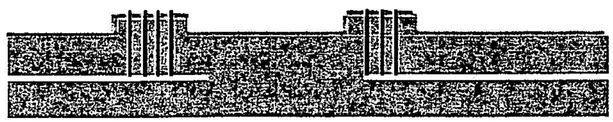
FIG. 9A
Create patterned raised structure
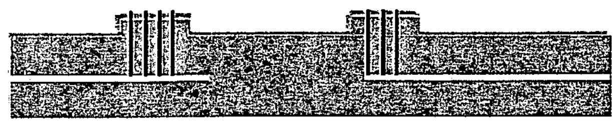
FIG. 9B
Conductive layer deposition
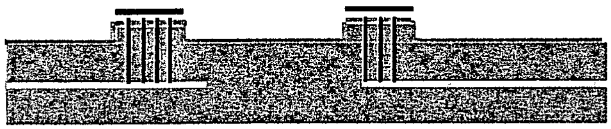
FIG. 9C
Catalyst layer deposition
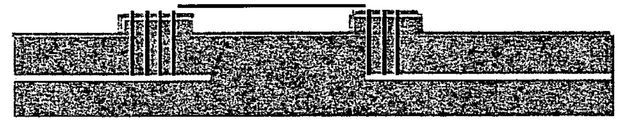
FIG. 9D
Electric-field guided CNT growth
FIG. 9E
Dielectric encapsulation
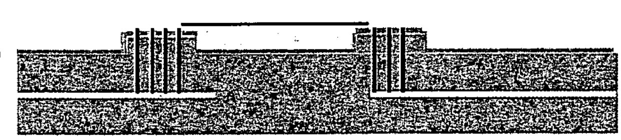
FIG. 9F
Chemical Mechanical Polishing

CARBON NANOTUBE INTERCONNECT

ORIGIN OF THE INVENTION

The invention described herein was made in the performance of work under a NASA contract and is subject to the provision of Section 305 of the National Aeronautics and Space Act of 1958, Public Law 85-568 (72 Atat. 435; 42 U.S.C. 2457).

FIELD OF THE INVENTION

This invention relates to use of carbon nanotubes (CNTs) as interconnects for integrated circuit (IC) manufacturing.

BACKGROUND OF THE INVENTION

An interconnect in an integrated circuit distributes clock, regulatory and other signals as well as power or ground voltages to various components and circuits on a chip. The International Technology Roadmap for Semiconductors (ITRS) emphasizes the high speed transmission requirements on a chip as the driver for future interconnect development. Near term and long term interconnect requirements for microprocessors (MPs) and for dynamic random access memories (DRAMs) are outlined in the ITRS. MPs require local, intermediate and global wiring solutions and present both material and processing difficulties. Susceptibility of common interconnect metals t electromigration at high current densities (above $10^6$ Amp/cm$^2$) is a problem. Copper interconnect, introduced in 1998, is now routinely used, even with minimum feature size down to 130 nm. However, electrical resistivity of copper increases with decreasing dimensions and is attributed to scattering at surfaces and at grain boundaries. These size effects are due to interface roughness and by use of small grain sizes, which are hard to overcome and cannot be avoided by simply cooling to lower the resistivity. With reference to processing, present interconnect technology relies upon successful development of three processes: dry etching to create trenches and vias; deposition to fill metal plugs; and planarization. The aspect ratio of contact apertures is now 12:1 and may reach 23:1 by the year 2016. Creating high aspect ratio apertures with straight walls and uniform diameters using dry etching is an extremely difficult task and is expected to become progressively more difficult with each succeeding generation. HBr etching of $SiO_2$ for a 9:1 aspect ratio contact hole has been found to provide a 135 nm diameter at one end and a 70 nm diameter at the other end of the hole by Hwang, Meyyappan, Mathod and Ranade, Jour. Vac. Sci. Technol. vol. 20B (2002) 2199. Aspect ratio-dependent etching becomes a serious problem with each new decrease in feature size. Plasma damage and cleaning of high aspect ratio features also pose concerns. Void-free filling of a high aspect ratio aperture is another concern.

Well known properties of CNTs, such as high current carrying capacity and material robustness, would make the CNTs ideally suited for use in electrical interconnects, if the fabrication problems could be resolved.

What is needed is a procedure or process sequence and associated system for providing an electrical interconnect, using an array of CNTs, that (1) provides reasonably uniform diameter CNTs with aspect ratios up to or higher than 100:1, (2) allows use of a variety of gap-filling insulating materials, (3) allows use of current densities of $10^6$ Amps/cm$^2$ and higher, (4) shows substantially no degradation at moderate or high current densities over long time intervals, and generally meets DRAM and microprocessor requirements.

SUMMARY OF THE INVENTION

These needs are met by the invention, which provides a procedure and associated system for fabricating an electrical interconnect (oriented vertically, horizontally or at a selected angle to the horizontal) with a gap-filling insulating material and with arbitrary but approximately uniform nearest neighbor CNT spacing to control electrical parameters such as electrical resistivity, maximum current density, representative cross sectional area for passage of current and the like.

The fabrication procedure includes the following processes: (1) depositing a selected electrically conductive substance of a first selected thickness on a substrate of selected material in a selected pattern; (2) depositing a selected catalyst substance in a selected pattern in a selected second thickness on the conductive substance; (3) growing an array of spaced apart multi-wall carbon nanotubes ("MWCNTs") on the selected pattern to a selected MWCNT length, using a plasma enhanced CVD process, so that each MWCNT is approximately normally aligned relative to an exposed surface of the catalyst substance at a first end of each MWCNT; (4) depositing a selected insulator material in an interstitial region between at least two MWCNTs and around each MWCNT so that the selected insulator encapsulates each MWCNT and the adjacent substrate surface (optional); (5) performing chemical mechanical polishing (CMP) and related processing of the selected insulator and the MWCNT array to provide an approximately planar surface of the selected insulator in which a second end of each of at least one MWCNT is exposed; and (6) providing an electrical interconnect between a second end of at least one MWCNT and another electrical connection.

This process supports CNT aspect ratios of 100:1 and higher, a variety of CNT array patterns, nearest neighbor CNT spacings of between 30 nm and 10 μm, current densities up to $10^9$ Amps/cm$^2$, and high current density operation over time intervals up to at least a few weeks with no substantial change in relevant electrical properties.

BRIEF DESCRIPTION OF DRAWINGS

FIGS. 2A–2F illustrate suitable array patterns for a catalyst used in the invention.

FIG. 3 is an electron microscope image showing ends of multi-wall CNTs extending above a planarized material ($SiO_w$) in which the CNTs are embedded.

FIGS. 4A–4F illustrate procedure steps corresponding to FIG. 1.

FIGS. 5A–5F are electron microscope images of CNTs.

FIGS. 6A–6C are atomic force microscope images of CNT arrays.

FIGS. 8A–8F and 9A–9F illustrate fabrication of CNT interconnects using raised structures, according to the invention.

DESCRIPTION OF BEST MODES OF THE INVENTION

Figure 1:
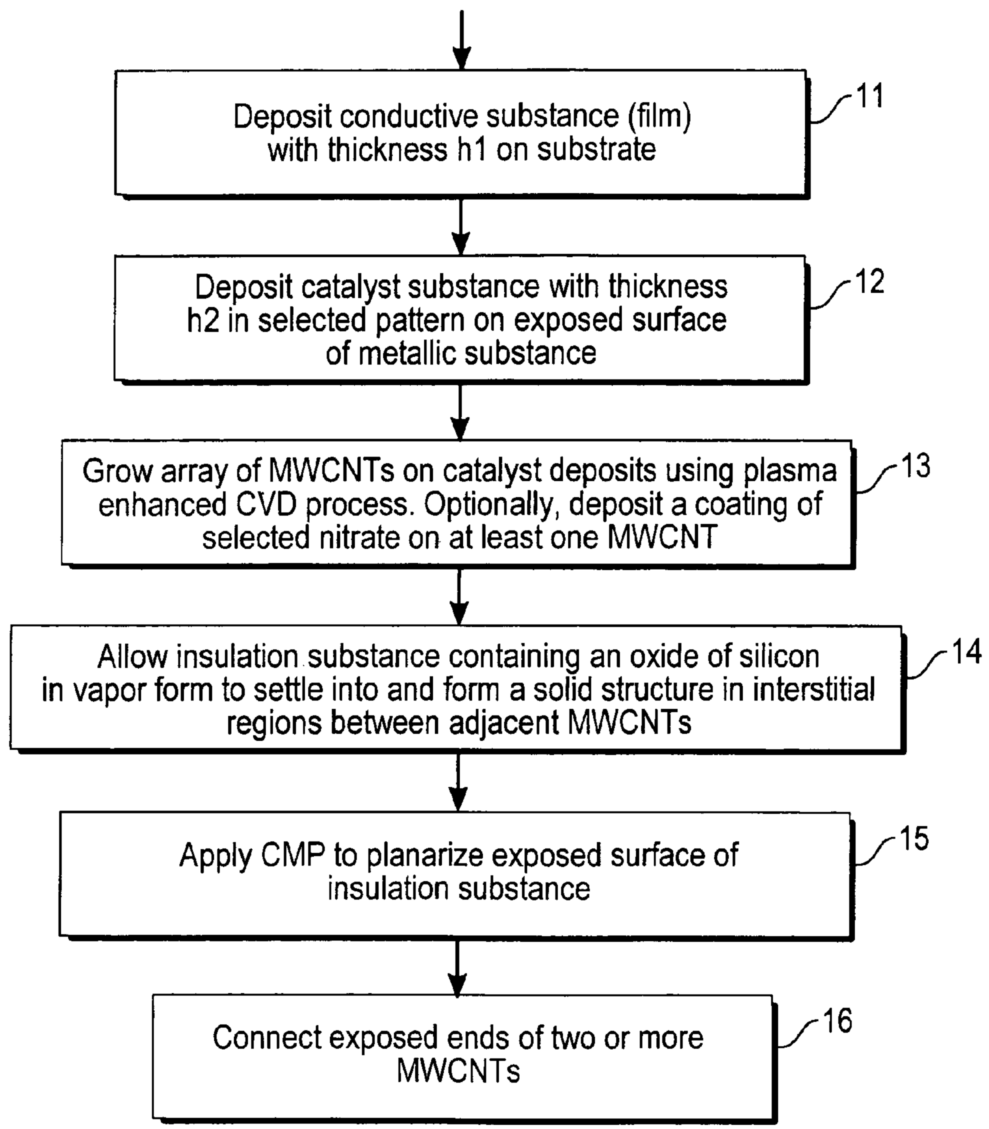
FIG. 1 illustrates is a flow chart illustrating a procedure for practicing the invention.

FIG. 1 is a flow chart of a procedure for fabricating an electrical interconnect according to one embodiment of the invention. In step 11, a selected conductive substance, having a conductive substance (film) first selected thickness h1 in a range 1 nm≦h1≦2 μm, or greater if desired, is deposited on a selected substrate. The substrate material may include a silicon oxide, $SiO_x$, a selected nitride, $Si_yN_z$, or another suitable insulating material, of thickness 200–500 nm or greater, on an Si wafer. The conductive substance may be Al, Mo, Cr, Ti, Ta, Pt, Ir or doped Si. A careful choice of the conductive substance (e.g., Mo, Cr or Ti) will eliminate or suppress diffusion of carbon within or through the conductive substance layer.

In step 12, a selected catalyst substance, such as Ni, Fe or Co, is deposited in a selected pattern, with a second thickness h2 in a range 1 nm≦h2≦30 nm, or higher if desired, on an exposed surface of the conductive substance. The selected pattern or grid for the catalyst substance may be rectangular (including a square), triangular, hexagonal, polygonal, linear, curvilinear or another suitable pattern, as illustrated in FIGS. 2A–2F, with a nearest neighbor spacing d in a range 30 nm≦d≦10 μm. The nearest neighbor spacings d are approximately uniform, or vary independently, and d can be less than 30 nm or greater than 10 μm if the circumstances are appropriate. Provision of a smaller spacing value d will provide a lower value for electrical resistivity ρ for the system, and inversely, so that resistivity can be controlled in part, by the choice of d.

In step 13 in FIG. 1, a single CNT or an array of at least two spaced apart CNTs are grown in a temperature range 400° C.≦T≦1000° C. (or higher, if desired) on part or all of the pattern of catalyst deposits set down in step 12. It is unlikely, but possible, that one or more additional CNTs may grow at locations other than the catalyst or pattern locations. The CNTs thus grown are preferably multi-wall CNTs (“MWCNTs”) and are encouraged to grow from a first end of each CNT approximately normal to the surface of the conductive substance deposited in step 11. An array of MWCNTs can be grown to greater heights than can a corresponding array of single wall CNTs (“SWCNTs”), before the CNTs begin to interleave with each other and to form a forest of CNTs. An MWCNT is usually a tubular or conical arrangement of several layers (2–8 or more) of CNTs that are grown by a somewhat different process than is an SWCNT. An MWCNT can reach a height in a range 0.1 μm–20 μm, or higher if special precautions are taken, and the average diameter D of an MWCNT can lie in a range 10 nm≦D≦200 nm. Preferably, the MWCNTs are grown using a plasma enhanced CVD growth process, using an inductively coupled plasma process or a dc plasma assisted hot filament process in which an electric field is imposed, having a direction approximately normal to the conductive substance surface and having a field intensity E in a range 20 volts/cm≦E≦5,000 volts/cm. Microwave or electron cyclotron resonance or radiofrequency, capacitively coupled plasmas can also be used to fabricate the MWCNTs. A thermal CVD process will not provide free-standing MWCNTs of sufficient height for the invention, under normal conditions. Relatively tall MWCNTs can be grown, with an aspect ratio (ratio of CNT length to CNT average diameter) as high as 100:1.

In step 14, a precursor substance, including an oxide or a nitride of silicon, is provided, and allowed to settle into and form a solid insulating structure around the CNTs, in interstitial regions between adjacent MWCNTs, and on other surfaces. The source gas for the insulator deposition may be tetraethoxysilane (TEOS) or another appropriate insulating precursor that (1) can settle and conformally form a solid $SiO_w$ or $Si_uN_v$ or similar structure in a region having a feature size in a range 30 nm–2 μm, or higher if desired, and (2) has very low (substantially 0) electrical conductivity.

If carbon diffusion into or through the insulator is a concern, a thin layer of thickness 1–10 nm of a selected nitride is optionally deposited, in step 14, on one or more (preferably all) of the CNTs to suppress such diffusion. This is similar to deposit of a thin layer of a selected nitride around Cu wire to suppress diffusion of Cu through whatever material would otherwise be in contact with the Cu.

In step 15, chemical mechanical processing (CMP) is applied to the assembly produced in steps 11–14 to planarize the exposed surface of the $SiO_w$ or $Si_uN_v$ and to expose a second end of most or all of the MWCNTs. The second end of many of the CNTs may extend above the planarized surface of the TEOS by 1–50 nm, as suggested in the SEM image in FIG. 3. This arrangement allows one or more of the exposed second ends of the MWCNTs to be connected to form an electrical interconnect (step 16, optional).

FIGS. 4A–4F illustrate the steps discussed in connection with the steps in the flow chart in FIG. 1.

FIGS. 5A–5F show scanning and transmission electron microscopy (SEM, TEM) images of some CNT arrays at various stages of processing. Well separated, vertically aligned MWCNTs are grown on 100 nm diameter and 2 μm diameter catalyst deposits in FIGS. 5A and 5B, respectively, which are defined by e-beam and uv-beam lithography, respectively. The 2 μm deposits each have approximately 20 MWCNTs growing thereon. The MWCNTs have aspect ratios up to about 100:1, with lengths varying from 0.1 μm to 20 μm and diameters varying from 10 nm to 200 nm, depending upon catalyst deposit diameter and thickness. FIG. 2C is an image of MWCNTs on a catalyst film deposited on alignment markers over 10 μm in diameter. Each MWCNT grown has substantially uniform diameter from the first end (at the catalyst) to the second end. The attachment of the MWCNTs is quite strong so that the MWCNTs cannot be wiped off easily.

One or more MWCNTs can also be grown in a direction oriented at a selected angle θ, including θ=0, to a horizontal line (i.e., parallel to the insulating surface), by orienting a direction of an electrical field E used to provide the plasma (step 13 in FIG. 1) in the direction relative to the horizontal line. One approach to such directed growth is discussed by Delzeit, Stevens, Nguyen and Meyyappan in “Directed Growth Of Single-Walled Carbon Nanotubes,” Intl. Jour. of Nanoscience, vol. 1 (2002) 197–203, where electrical field intensities of 0.5–2 Volts/μm were used for SWCNT orientation.

$SiO_w$ deposition (from step 14 in FIG. 1) is found to be conformal around each MWCNT, metallized substrate surface and dielectric film. When the $SiO_w$ film size grows beyond about 2 μm, the film tends to break into grains about 2–3 μm in diameter. For catalyst deposit diameters smaller than about 2 μm, we find that the MWCNT is normally embedded in a single $SiO_w$ grain, whereas the MWCNT grown on a catalyst deposit with a larger size often lies in more than one $SiO_w$ grain, as indicated in FIGS. 5D, 5E and 5F.

Voids of size up to about 100 nm often occur in the $SiO_w$ film as a result of grain boundaries. This undesirable feature can be avoided or controlled, for catalyst deposit diameters less than about 2 μm, by providing a very slow CVD rate for the TEOS deposit. CMP (step 15 in FIG. 1) removes the excess silicon oxide and breaks the MWCNT bundle that extends above the exposed silicon oxide surface, resulting in a planarized SiOw surface with second ends of the MWCNTs exposed, as indicated in FIG. 5G. In some instances, the second ends of the MWCNTs extend above the planarized surface by 1–50 nm.

The planarized $SiO_w$-MWCNT structure can be subjected to current-voltage-current (I-V) measurements, using atomic force spectroscopy (AFM), modified with a current sensing module, referred to as a CSAFM. Electrical properties of individual CNTs can be measured, using a contact mode cantilever beam coated with a Pt or similar conductive film so that a voltage bias can be applied. FIGS. 6A–6C illustrate the topography, deflection and current images of an embedded CNT sample and corresponding profiles along a line lying in an exposed surface, as highlighted. The surface topography indicates that a CNT protrudes or extends beyond the planarized $SiO_w$ surface, which is consistent with the SEM image in FIG. 3. Dark spots in FIG. 6C correlate well with the protruding second ends of the MWCNTs, indicating that the MWCNTs have much high electrical conductance than does the surrounding $SiO_w$ matrix. The MWCNTs appear to be well separated in the $SiO_w$ matrix.

Figure 7:
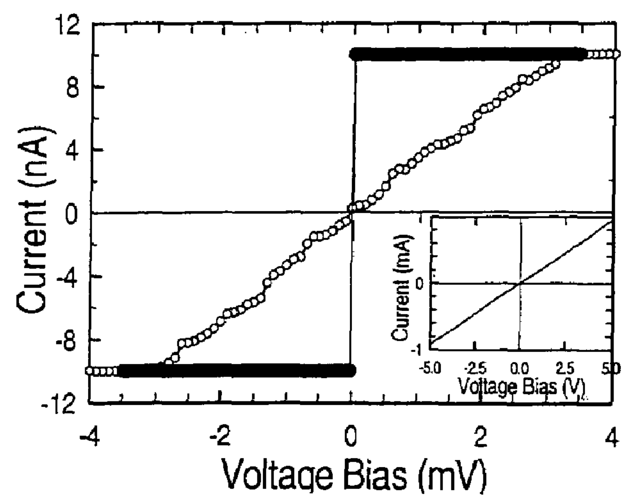
FIG. 7 is a graphical view of measured current versus voltage for a single MWCNT and for an MWCNT bundle fabricated according to the invention.

FIG. 7 is a graphical view of the I-V curve for a single MWCNT and for a compact bundle of CNTs in the embedded array. The resistance for a single MWCNT and for the bundle are about 50–300 KΩ and less than 2 kΩ, respectively. The I-V curve for the $SiO_w$ is a flat line at substantially 0 Amps, with a 1 picoAmp rms noise value. Measurements of a parallel connected MWCNT bundle with 5 Volts impressed indicate a resistance of about 5.2 KΩ. Repeatedly applying $10^6$ Amp/$cm^2$ current density for several hours did not indicate any damage, based on the I-V measurements. One reference, Wei, Vajtai and Ajayn, Appl. Phys. Lett, vol. 79 (2001) 1172, reports no degradation in a CNT for application of $10^{10}$ Amp/$cm^2$ over a time period of several weeks.

Ballistic transport in an MWCNT with quantized conductance corresponds to a resistance of 12.9 kΩ. The resistance measured here for a single MWCNT is more than one order of magnitude higher than the theoretical value. However, use of a compact bundle of MWCNTs, or multiple MWCNTs connected in parallel, in contact with a device or component may be sufficient for global wiring, thus offering a solution where global wiring is required.

There are several reasons, discussed below, why the observed resistance is larger than the theoretical value. First, the electrical contacts to the nanotubes may be imperfect. In most studies by other groups, contact occurs to a sidewall of the CNTs. In such instance, the contact is made only to the outermost shell of the MWCNT. In our optimal approach, contact is made to all shells in an MWCNT, which is favorable for interconnect applications. Theoretical studies indicate that the contact length between a metal and a CNT is critical for achieving low resistance. The conductance drops rapidly when the contact length is less than about 10 nm. For the point contact geometry of a CSAFM used here, contact length is a valid concern and may contribute to the decrease in resistance. In practical applications, a catalyst metal, such as Ni, Fe or Co may be deposited on top of an MWCNT before deposition of a top metal line. Thermal annealing in the presence of a transition metal can improve the electrical contact between a CNT and a metal line. With reference to a first end of a CNT, MWCNTs are grown directly from the substrate and show strong attachment to the metal film on the substrate, and a good electrical contact can be achieved.

The quality of the CNT material itself may contribute to the observed resistance. Most plasma-grown structures are somewhat defective and are characterized by periodic, bamboo-like, or ice cream cone-like, closed shells along a longitudinal axis, as confirmed by TEM images. Where an ideal MWCNT will have all walls parallel to the longitudinal axis (angle $\phi=0$), most plasma-grown structures manifest small, non-zero $\phi$ values and are sometimes referred to as multi-wall carbon nanofibers (MWCNFs). Further, electrons must cross graphite layers in such a structure to be transported from one end to another end of a CNT, which provides a larger associated resistance similar to transport across a basal plane of graphite. True ballistic transport is possible with ideal MWCNTs, but not necessarily with the non-ideal MWCNTs now available. This performance can be improved by annealing the CNT array at a temperature T>700° C. and/or by doping the CNT array with $I^-$ or $Br^-$ ions.

The invention disclosed here eliminates problems associated with etching, cleaning and filling of high aspect ratio electrical interconnect structures. Modern IC technology requires multi-level fabrication and metallization, which is also provided by the invention, in at least three ways.

(1) For multi-level vertical interconnects, the planarized device in step 16 of FIG. 1 can be used as a (new) substrate to repeat or iterate the processing steps 11–16 to generate a second layer. This approach can be applied several times to provide a multi-level CNT interconnect system.

(2) For substantially horizontal interconnects, the catalyst is deposited in raised spots, 10 nm–10 μm in height, and an electric filled with a substantially horizontal direction is applied during CNT growth to generate substantially horizontally oriented CNTs. MWCNTs and/or SWCNTs can be grown in this manner. Either PECVD or simple thermal CVD can be used for CNT growth. The raised feature for catalyst deposition prevents or suppresses van der Waals surface interactions so that the applied electric field can direct growth of free suspended CNTs between the raised features. A dielectric encapsulation step and a CMP step, analogous to steps 14 and 15, can be applied to produce a planarized structure with CNT interconnect lines embedded within the insulating materials. See Ural, Li and Dai, "Electric-field-aligned growth of single-walled carbon nanotubes on surfaces," Appl. Phys. Lett. 81 (2002) 3463, for additional details.

Figures 8A, 8B, 8C, 8D, 8E, 8F:
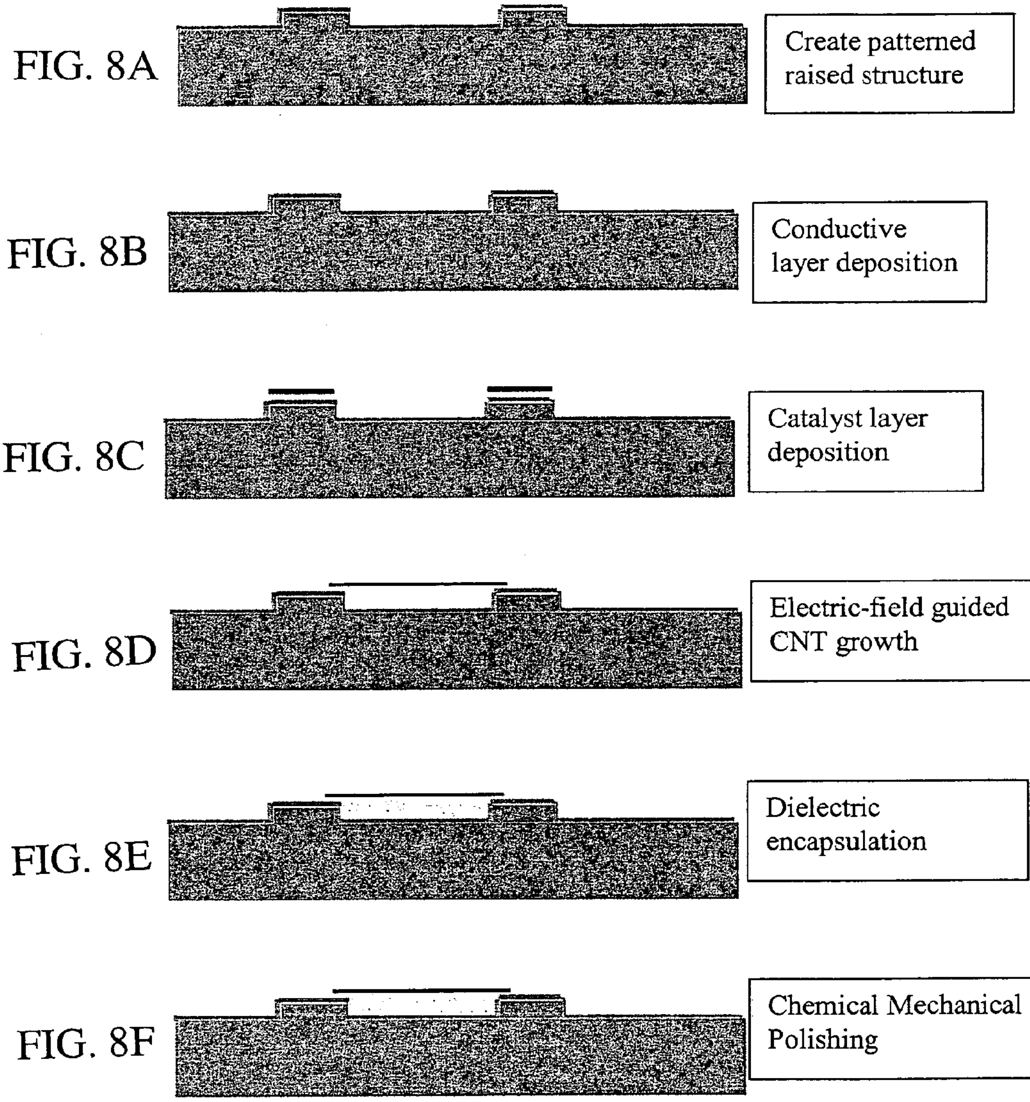

FIGS. 8A–8F and 9A–9F illustrate how vertical and/or horizontal CNT interconnect structures and more complex vertical/horizontal interconnect structures may be generated. In FIG. 8A, a raised structure with a selected pattern is created. In FIG. 8B, a conductive layer is deposited. In FIG. 8C, a catalyst layer is deposited on one or more of the raised structures. In FIG. 8D, electric field-guided CNT growth is implemented, for example, between two adjacent raised structures (with θ=90° in this Figure). In FIG. 8E, one or more (preferably all) of the CNT interconnects thus grown are encapsulated with a selected dielectric. In FIG. 8F, CMP processing is selectively applied to the exposed surface(s) of the structure provided in FIG. 8E. FIGS. 9A–9F correspond to FIGS. 8A–8F, respectively, where a sequence of two or more vertical/horizontal CNT interconnect structures are fabricated.

Figure 10:
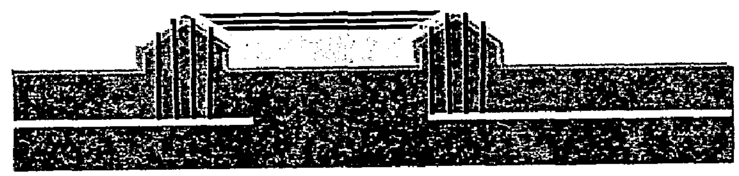
FIG. 10 illustrates use of the invention to build a multilevel structure

(3) A single level or multi-level CNT can be generated to provide a three-dimensional structure. This is particularly attractive for microprocessor architectures. FIG. 10 illustrates a multi-level interconnect structure, having diagonal and horizontal MWCNTs, that can be fabricated using the invention.

What is claimed is:

1. A method for fabricating an electrical interconnect, the method comprising:

depositing a selected conductive substance of a first selected thickness on a substrate of selected material;

depositing a selected catalyst substance in a selected pattern in a selected second thickness on the conductive substance;

growing an array of one or more spaced apart multi-wall carbon nanotubes ("MWCNTs") on the selected pattern to a selected MWCNT third thickness, using a plasma enhanced CVD process, so that each MWCNT is oriented at approximately a selected angle θ, relative to an exposed surface of the conductive substance at a first end of the at least one MWCNT;

depositing a selected insulator material around at least one MWCNT so that the selected insulator encapsulates the at least one MWCNT; and performing chemical mechanical polishing of the selected insulator and of the MWCNT array to provide an approximately planar surface of the selected insulator in which a second end of each of the at least one MWCNT is exposed above an exposed surface of the insulator by a distance in a range of 1–50 nm.

2. The method of claim 1, further comprising choosing said selected conductive substance to include at least one of Al, Mo, Cr, Ti, Ta, Pt, Ir and highly doped Si.

3. The method of claim 1, further comprising choosing said first thickness in a range at least equal to 1 nm.

4. The method of claim 1, further comprising choosing said catalyst substance to include at least one of Ni, Fe, and Co.

5. The method of claim 1, further comprising choosing said second thickness in a range 1–30 nm.

6. The method of claim 1, further comprising choosing said selected pattern from the group of patterns consisting of a rectangular array, a triangular array, a hexagonal array, a linear array and a curvilinear array.

7. The method of claim 6, further comprising choosing a nearest neighbor spacing for said pattern in a range 30 nm–20 μm.

8. The method of claim 1, further comprising performing said plasma enhanced process as an inductively coupled plasma process or as a dc plasma assisted hot filament process.

9. The method of claim 1, further comprising performing said plasma enhanced process as a capacitively coupled microwave plasma process or as a capacitively coupled electron cyclotron resonance process or as a capacitively coupled radiofrequency process.

10. The method of claim 1, further comprising choosing said selected insulator from a group consisting of an oxide of silicon and a nitride of silicon.

11. The method of claim 10, further comprising providing tetraethoxysilane as a precursor for said insulator material adjacent to said at least one MWCNT.

12. The method of claim 1, further comprising growing said at least one MWCNT with an aspect ratio of at least 100:1.

13. The method of claim 1, further comprising growing said at least one MWCNT with a length, measured substantially normal to said conductive substance exposed surface, in a range 0.1–20 μm.

14. The method of claim 1, further comprising growing said at least one MWCNT with a substantially uniform MWCNT diameter, measured substantially parallel to said conductive substance exposed surface.

15. The method of claim 1, further comprising growing at least two of said MWCNTs with an MWCNT spacing, measured substantially parallel to said conductive substance exposed surface, in a range 30 nm–20 μm.

16. The method of claim 1, further comprising providing an electrical interconnect between an exposed second end of said at least one MWCNT and a selected electrical component.

17. The method of claim 16, further comprising passing an electrical current in a range having a current density in a range between $10^6$ Amps/cm$^2$ and $10^{10}$ Amps/cm$^2$ through said at least one MWCNT.

18. A method for fabricating an electrical interconnect, the method comprising:

depositing a selected conductive substance of a first selected thickness on a substrate of selected material;

depositing a selected catalyst substance in a selected pattern in a selected second thickness on the conductive substance;

providing an electric field, oriented substantially at a selected angle θ relative to an exposed surface of the conductive substance, where the electric field has an intensity in a range E=20–5,000 volts/cm and the angle θ lies in a range of about $0° \leqq \theta \leqq 90°$;

growing an array of one or more spaced apart multi-wall carbon nanotubes ("MWCNTs") on the selected pattern to a selected MWCNT third thickness, using a plasma enhanced CVD process, so that each MWCNT is oriented approximately at the selected angle θ, relative to an exposed surface of the conductive substance at a first end of the at least one MWCNT;

depositing a selected insulator material around at least one MWCNT so that the selected insulator encapsulates the at least one MWCNT; and performing chemical mechanical polishing of the selected insulator and of the MWCNT array to provide an approximately planar surface of the selected insulator in which a second end of each of the at least one MWCNT is exposed above an exposed surface of the insulator.

19. A method for fabricating an electrical interconnect, the method comprising:

depositing a selected conductive substance of a first selected thickness on a substrate of selected material;

depositing a selected catalyst substance in a selected pattern in a selected second thickness on the conductive substance;

growing an array of one or more spaced apart multi-wall carbon nanotubes ("MWCNTs") on the selected pattern to a selected MWCNT third thickness, using a plasma enhanced CVD process, so that each MWCNT is oriented at approximately a selected angle θ, relative to an exposed surface of the conductive substance at a first end of the at least one MWCNT;

depositing a selected insulator material around at least one MWCNT so that the selected insulator encapsulates the at least one MWCNT;

performing chemical mechanical polishing of the selected insulator and of the MWCNT array to provide an approximately planar surface of the selected insulator in which a second end of each of the at least one MWCNT is exposed above an exposed surface of the insulator; and providing a coating of a selected thickness of a selected nitride for at least one of the array of MWCNTs, before the insulator material is deposited around the at least one of the MWCNTs.

* * * * *